United States Patent
Leung

(10) Patent No.: US 10,474,779 B1
(45) Date of Patent: Nov. 12, 2019

(54) BISECTION METHODOLOGY FOR ON-CHIP VARIATION TOLERANT CLOCK SIGNAL DISTRIBUTION IN AN INTEGRATED CIRCUIT

(71) Applicant: Juniper Networks, Inc., Sunnyvale, CA (US)

(72) Inventor: Vincent C. Leung, Palo Alto, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 137 days.

(21) Appl. No.: 15/713,305

(22) Filed: Sep. 22, 2017

(51) Int. Cl.
*G06F 17/50* (2006.01)

(52) U.S. Cl.
CPC ...... *G06F 17/5059* (2013.01); *G06F 17/5077* (2013.01); *G06F 2217/62* (2013.01)

(58) Field of Classification Search
CPC ............. G06F 17/5077; G06F 2217/62; G06F 17/5059
See application file for complete search history.

(56) References Cited

U.S. PATENT DOCUMENTS

| | | | | |
|---|---|---|---|---|
| 5,784,600 A * | 7/1998 | Doreswamy | ........ | G06F 17/5077 713/503 |
| 6,053,950 A * | 4/2000 | Shinagawa | ........... | G06F 1/10 703/19 |
| 6,272,668 B1 * | 8/2001 | Teene | ................ | G06F 17/505 716/113 |
| 6,434,731 B1 | 8/2002 | Brennan et al. | | |
| 6,502,222 B1 * | 12/2002 | Tetelbaum | ............ | G06F 1/10 716/114 |
| 6,522,598 B2 * | 2/2003 | Ooishi | ............. | G11C 7/1051 365/189.08 |
| 6,816,991 B2 | 11/2004 | Sanghani | | |
| 6,897,696 B2 * | 5/2005 | Chang | ............. | H03K 5/1506 327/175 |
| 6,897,699 B1 * | 5/2005 | Nguyen | ................ | G06F 1/10 327/295 |
| 7,823,112 B1 | 10/2010 | Makarov et al. | | |
| 8,214,790 B2 * | 7/2012 | Masleid | .......... | G06F 17/5077 716/113 |
| 8,631,378 B2 * | 1/2014 | Lasher | ............. | G06F 17/5077 703/16 |
| 8,736,342 B1 * | 5/2014 | Bucelot | ................. | G06F 1/10 327/291 |
| 9,477,257 B1 * | 10/2016 | Kulkarni | ............... | G06F 1/08 |
| 2011/0209112 A1 * | 8/2011 | Laub | ............... | G06F 17/5068 716/132 |

(Continued)

*Primary Examiner* — Helen Rossoshek
(74) *Attorney, Agent, or Firm* — Harrity & Harrity, LLP

(57) ABSTRACT

A clock distribution component may include a plurality of electrically connected buffer pair triads arranged in a plurality of levels. A buffer pair triad, of the plurality of buffer pair triads, may include three buffer pairs that are connected via wire. Each buffer pair triad may share at least one buffer pair with one or more buffer triads of the plurality of buffer pair triads. Buffer pairs, of the plurality of buffer pair triads, may be arranged in buffer rows and buffer columns. The plurality of levels may include a first level associated with a first buffer pair triad and one or more additional levels. Each level of the one or more additional levels may include at least three buffer pair triads and at least two more buffer pair triads and/or at least two less buffer pair triads than an adjacent level of the one or more additional levels.

20 Claims, 8 Drawing Sheets

(56) References Cited

U.S. PATENT DOCUMENTS

| | | | |
|---|---|---|---|
| 2012/0124409 A1* | 5/2012 | Miyano | G06F 1/10 713/503 |
| 2014/0298283 A1* | 10/2014 | Chen | G06F 17/5068 716/114 |
| 2016/0126954 A1* | 5/2016 | Zangi | H03K 19/0016 326/40 |
| 2017/0004249 A1* | 1/2017 | Feng | G06F 17/5081 |

* cited by examiner

BISECTION METHODOLOGY FOR ON-CHIP VARIATION TOLERANT CLOCK SIGNAL DISTRIBUTION IN AN INTEGRATED CIRCUIT

BACKGROUND

Clock circuitry may ensure that signals within an integrated circuit are captured at predetermined locations on the integrated circuit at particular times. For example, a clock signal may be produced by a clock generator (e.g., a phase-locked loop, delay-locked loop, etc.), and may be distributed to one or more clock distribution components (e.g., clock macros) throughout the integrated circuit, such that the clock signal reaches the one or more clock distribution components at the same time.

SUMMARY

According to some possible implementations, a clock distribution component may include a plurality of electrically connected buffer pair triads arranged in a plurality of levels. A buffer pair triad, of the plurality of buffer pair triads, may include three buffer pairs that are connected via wire. Each buffer pair triad may share at least one buffer pair with one or more buffer triads of the plurality of buffer pair triads. Buffer pairs, of the plurality of buffer pair triads, may be arranged in buffer rows and buffer columns. The plurality of levels may include a first level associated with a first buffer pair triad and one or more additional levels. Each level of the one or more additional levels may include at least three buffer pair triads and at least two more buffer pair triads and/or at least two less buffer pair triads than an adjacent level of the one or more additional levels.

According to some possible implementations, a method may include generating, by a device, one or more clock distribution components using a set of design properties. The set of design properties may include at least one of: a design property indicating that a clock distribution component is to include a plurality of electrically connected buffer pair triads arranged in a plurality of levels, a design property indicating to use one or more dimensions associated with a schematic of an integrated circuit as dimensions for the one or more clock distribution components, or a design property indicating that the one or more clock distribution components are to include a fixed height. The method may include executing, by the device and after generating the one or more clock distribution components, a signal testing procedure to determine whether a clock signal travels through each of the one or more clock distribution components in a threshold time period.

According to some possible implementations, an integrated circuit may include one or more clock distribution components. The one or more clock distribution components may include a plurality of electrically connected buffer pair triads arranged in a plurality of levels. A buffer pair triad, of the plurality of buffer pair triads, may include three buffer pairs that are connected via wire. Each buffer pair triad, of the plurality of buffer pair triads, may share at least one buffer pair with one or more buffer pair triads of the plurality of buffer pair triads. The plurality of levels may include a first level associated with a first buffer pair triad and one or more additional levels. The one or more additional levels may include at least three buffer pair triads. Each additional level of the one or more additional levels may include at least two or more buffer pair triads and/or at least two less buffer pair triads than an adjacent level of the one or more additional levels.

DETAILED DESCRIPTION

Figure 1:
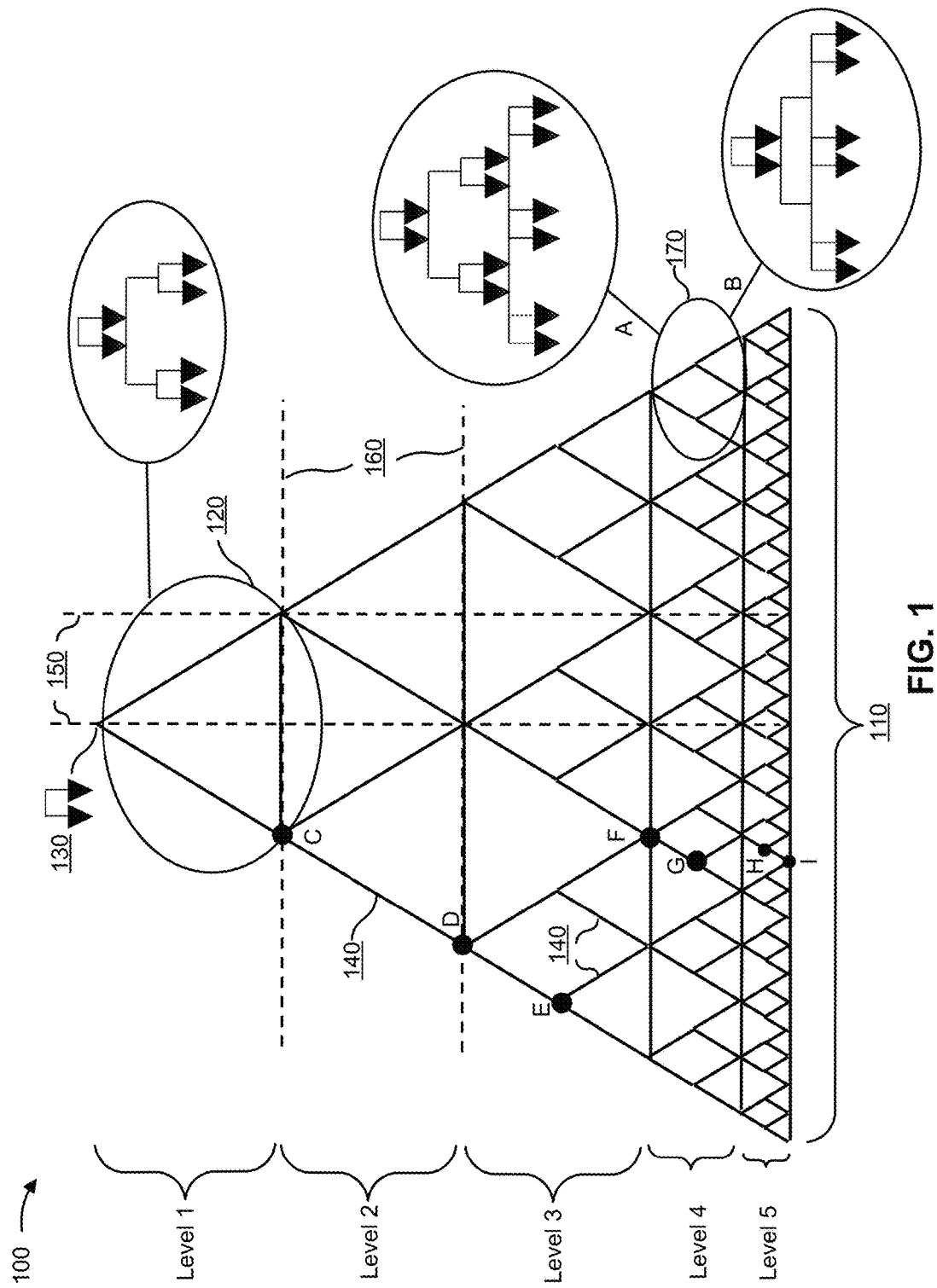
FIG. 1 is a diagram of an example clock distribution component.

The following detailed description of example implementations refers to the accompanying drawings. The same reference numbers in different drawings may identify the same or similar elements.

Digital integrated circuits may use a clock signal to synchronize state elements (e.g., rising edge D flip-flops) within a clock domain. For example, on the rising edge of the clock signal, a D flip-flop may launch a stored state (e.g., a 1 or a 0) to a configuration of logic gates. The output of the logic gates may terminate at another D flip-flop which captures the signal during the next consecutive rising edge of the clock signal. In this way, the clock is critical for ensuring that all parts of a digital integrated circuit are synchronized.

In an integrated circuit, the clock signal may need to be distributed from a single clock source to millions of state elements distributed across a large area. The paths from the single clock source to the millions of state elements may have large differences in metal interconnect (wire) lengths. However, the signal delay through the paths must be identical. For example, a longer wire may have a longer signal delay than a shorter wire. Thus, a first state element that is located further from the clock source than a second state element may have a longer signal delay. Furthermore, two paths of different lengths may be made electrically identical, but not physically identical, by adding "dummy" wire to the shorter path such that both paths have similar lengths and delays.

Additionally, a clock signal may be buffered along a long wire to regenerate the signal strength. A buffer, either inverting or non-inverting, may add significant delay. Thus, given two paths of identical length, a path with two buffers may have more delay than a path with a single buffer. These two path delays may be made electrically equal, but not physically equal, by modifying the buffer strengths. For example, for the path with two buffers, the buffers may be made stronger (i.e., faster) while the path with a single buffer can be made weaker (i.e., slower). By modifying the delay of the buffers, the two different path delays can be balanced.

For the purpose of distributing the clock signal to synchronize state elements, only the skew between paths, not the delay within a path, is relevant. As long as all paths share the same delay, the paths will be balanced (i.e., no skew between signal end points) and the state elements may be synchronized. In some cases, techniques to balance signal paths with different lengths and/or different numbers of buffers may be performed by modifying the buffer strength and/or wire length.

However, these methods only balance the signal paths for a specific voltage, temperature, and manufacturing process corner (PVT). As the PVT varies, the electrically similar but physically different paths may have delays varying by a different percentage and may no longer remain balanced. Signal delays through a buffer are very sensitive to PVT. For example, as voltage increases a buffer may have a decreased delay while temperature may either increase or decrease delay depending on the specific circuit and process technology. As PVT varies, the percentage change in delay may be identical for physically identical buffers. However, buffers of different strengths may incur delay variations of different percentages as PVT changes. Thus, two paths with a different number of buffers that are electrically balanced by tuning the buffer strengths may see delays increase or decrease by different amounts as PVT varies. Electrically identical but physically different wires may also see delays change by different amounts as PVT varies.

In an integrated circuit, metal interconnects (wires) are manufactured with different layers. The layers are connected by a via. Different metal layers and vias all vary by different percentages as PVT changes. Thus, adding "dummy" wire to make two paths identical in length may result in the usage of different metal layers and vias. As a result, the delays may change by a different percentage as PVT changes. Only paths which use the exact same buffers and metal interconnects may have delays vary by the exact same amount as PVT changes. However, as described herein, physically identical paths may remain balanced as PVT changes.

A clock distribution may use buffer trees to deliver a clock signal from a single clock source to millions of state elements placed within a chip with identical delays. When designing a clock distribution, considerations include tolerance to voltage, process, and temperature variations, power consumption, design effort, skew between signal end points, and/or the like. In some cases, the clock distribution may consume 40% of the power in a microprocessor or application-specific integrated circuit (ASIC). The amount of skew between clock paths may influence the performance of the integrated circuit. The clock period determines the amount of usable cycle time where work can be performed. As skew between paths increases, useable cycle time decreases and less work may be done.

One clock distribution technique may use clock tree synthesis (CTS). This is a fully automated technique where a computer-aided design (CAD) tool may utilize an algorithm to randomly modify buffer strengths and wire lengths in an attempt to electrically balance millions of paths. While CTS requires minimal design effort, the large number of physically different wires and buffers may have difficulty remaining balanced as PVT changes. In addition, there may be significant skew between clock paths that degrades performance, as the algorithm cannot converge the value of clock skew to zero.

Another technique may utilize a clock mesh with a repeated pattern (e.g., a full mesh approach where a regular mesh is used for both global and block level distribution). Driving this clock mesh are vertical and horizontal clock distribution components (i.e., clock macros) which distribute the clock signal source to the mesh (e.g., see FIG. 5A). Unlike the randomly generated clock tree used in CTS, a mesh approach has the potential for creating physically identical clock distribution components, all with physically identical buffers and wire lengths, allowing for perfect PVT tracking and very low skew between paths.

One disadvantage of the clock mesh is higher design effort as many of the components are custom designed. However, physically identical clock distribution components are difficult to achieve in practice due to regions within an integrated circuit which cannot be used (i.e., blockages). For example, a microprocessor or ASIC generally requires the use of embedded memory blocks where buffers and wires cannot be placed. To avoid blockage regions (e.g., embedded memory), clock distribution components may be created that are different widths. As such, the only way to make the physically different signals paths balanced are to tune the buffers and/or wires to make the delays electrically equivalent. This creates a problem of maintaining balance as PVT changes. In addition, unlike the fully automated CTS approach, clock distribution components are often custom designed. The process of electrically balancing the different paths requires a time-consuming trial and error approach, and may be prone to human errors.

Some implementations described herein provide a method for automatically generating a clock distribution component that is able to distribute clock signals from a clock generator to one or more signal end points on an integrated circuit while tolerating manufacturing and voltage variations. For example, a user device may use a set of design properties to generate a template for a clock distribution component. In this case, a second device may use the template to create one or more clock distribution components.

Additionally, a third device may cut one or more portions of the one or more clock distribution components to allow the one or more clock distribution components to be placed into an integrated circuit. In this case, the user device (or a fourth device) may execute a signal testing procedure to determine whether a clock signal travels through the one or more clock distribution components in a threshold time period (e.g., in an equal time period). Furthermore, the template for creating clock distribution components may apply to integrated circuits of different sizes by altering the dimensions of the template while maintaining the set of design properties, thereby allowing the template to be reused for any number of different integrated circuit design. Alternatively, a user device may use a set of design properties to generate a clock distribution component directly, as described further herein.

By using a set of design properties to automatically create balanced clock distribution components, clock signals may be distributed to one or more signal end points in an integrated circuit, thereby significantly decreasing design time (e.g., a clock distribution providing signal synchronization may be generated in several hours instead of five to six months). Additionally, by using a uniform template with physically identical buffers and wires, the effect of voltage and manufacturing variances may be minimized or eliminated (e.g., by creating electrically balanced but physically different clock distribution components). Manufacturing and voltage variations will have a different timing impact on different sized buffers and wire lengths. Thus, electrically balancing mismatched delays by changing buffer size or wire lengths will only work for a specific manufacturing and voltage corner and temperature (PVT). Once PVT changes the clock distribution component may become unbalanced again. However, a physically identical clock distribution component will ensure that all path delays vary by the exact same amount as PVT changes. For example, if PVT causes a buffer or wire delay to speed up, all buffers and wires in a physically matched clock distribution component may speed up by the same amount of time. Thus, the signal end points may still have identical delays and zero skew.

Additionally, by matching the delays of all paths with re-convergence (e.g. paths which are shorted together), the clock distribution utilizes less power than a clock distribution without the clock distribution components described herein, thereby conserving power and improving performance of the integrated circuit. Clock distribution components often have buffer outputs shorted together to improve tolerance for PVT changes. Skew between unbalanced buffers may result in a short circuit current as one buffer would be driving high while the other is driving low.

FIG. 1 is a diagram of an example implementation 100 of a clock distribution component. Specifically, FIG. 1 is a diagram illustrating an overview of a clock distribution component. The overview shown in FIG. 1 conceptually illustrates a layout of a clock distribution component 110. While example implementation 100 may be viewed as a "horizontal" implementation, in practice, implementations may be implemented independent of direction (e.g., a clock delay component may be placed into a circuit horizontally, vertically, or at any angle needed to satisfy the requirements of a particular circuit).

In some implementations, clock distribution component 110 may be implemented at one or more physical locations within an integrated circuit. In some implementations, clock distribution component 110 may be implemented as part of a global clock distribution. Additionally, or alternatively, clock distribution component 110 may be implemented as part of a local clock distribution within a design block. Furthermore, clock distribution component 110 may be implemented as part of a clock distribution that uses a gridded methodology, an H-tree methodology, a spine methodology, or the like.

As shown, clock distribution component 110 may include a set of electrically connected buffer pair triads 120 arranged in a set of levels. The buffer pair triads 120 may include buffer pairs 130 and wires 140. A buffer pair 130 may be a pair of devices (e.g., an inverting device, a non-inverting device, etc.) capable of transferring (e.g., providing, amplifying, etc.) a clock signal through clock distribution component 110. In some implementations, each buffer pair 130 in a buffer pair triad 120 may be directly connected (e.g., directly or indirectly via wire 140) to every other buffer pair 130 in the buffer pair triad 120. In some implementations, each buffer pair triad 120 may share at least one buffer pair 130 with one or more buffer pair triads 120 of the set of buffer pair triads 120. In some implementations, buffer pair 130 may cause a clock signal traveling through buffer pair 130 to incur a fixed delay.

In some implementations, each buffer pair triad 120 may share at least one buffer pair 130 with one or more buffer pair triads 120 of the set of buffer pair triads 120. In some implementations, one or more buffer pair triads 120 may include three buffer pairs 130. Additionally, or alternatively, one or more buffer pair triads 120 may include six buffer pairs 130. Additionally, or alternatively, one or more buffer pair triads 120 may include a different number of buffer pairs 130.

In some implementations, buffer pair triads 120 may be arranged in a set of levels. For example, the set of levels may include a first level associated with a first buffer pair triad (shown as the circled buffer pair triad 120 at the top of clock distribution component 110). Additionally, the set of levels may include one or more additional levels (shown as levels 2 through 5). In some implementations, each additional level may include at least three buffer pair triads 120. Additionally, the one or more additional levels may include at least two more buffer pair triads 120 and/or at least two less buffer pair triads 120 than adjacent levels (e.g., an adjacent first level, an adjacent additional level, etc.).

In some implementations, buffer pairs 130 may be arranged in buffer columns 150 and buffer rows 160. For example, each buffer pair triad 120 may include buffer pairs 130 in three buffer columns 150 and two buffer rows 160. In some cases, a first buffer pair 130 may share a buffer column 150 with one or more buffer pairs 130 in alternating buffer rows 160.

As an example, a first buffer pair triad 120 (e.g., the circled buffer pair triad 120 at the top of clock distribution component 110) may include a root buffer pair 130 (shown by the buffer pair at the top of clock distribution component 110) associated with a first buffer column 150 (e.g., the column going through the center of clock distribution component 110). In this case, the first buffer pair triad 120 may include two child buffer pairs 130, where the first child buffer pair 130 is associated with a second buffer column 150 and a second child buffer pair 130 is associated with a third buffer column 150.

Continuing with the example, an additional level adjacent to the first level (shown as level 2) may include a second buffer pair triad 120, a third buffer pair triad 120, and a fourth buffer pair triad 120. In this case, the second buffer pair triad 120 and the third buffer pair triad 120 may share the first child buffer pair 130 with the first buffer pair triad 120. The third buffer pair triad 120 and the fourth buffer pair triad 120 may share the second child buffer pair 130 with the first buffer pair triad 120. The second buffer pair triad 120, the third buffer pair triad 120, and the fourth buffer pair triad 120 may share a buffer pair 130 included in the first buffer column 150.

In some implementations, one or more buffer pair triads 170 associated with the one or more additional levels may include at least three additional buffer pairs 130. In some cases, the three additional buffer pairs 130 may be located at bisections of the wires 140 that connect the buffer pairs 130. In this case, two of the three additional buffer pairs 130 may be directly connected via wire 140. In some cases, a template of clock distribution component 110 may be updated to modify a number of additional levels that include additional buffer pairs 130 (e.g., based on needs of a particular integrated circuit).

In some implementations, a buffer pair associated with one or more additional levels may be connected to two or more additional buffer pairs. As shown by the indicator "A" that is associated with reference number 170, a first buffer pair in a first buffer row 160 may connect to a second buffer pair and a third buffer pair that are in a second buffer row 160. Additionally, the second buffer pair and the third buffer pair may connect to a fourth buffer pair, a fifth buffer pair, and a sixth buffer pair, that are located in a third buffer row 160.

In some implementations, a buffer pair associated with one or more additional levels may be connected to a wire, and the wire may be connected to two or more additional buffer pairs. As shown by the indicator "B" that is associated with reference number 170, a first buffer pair in a first buffer row may connect to a wire that is placed in a second buffer row 160 (e.g., instead of additional buffer pairs), and the wire may connect to a second buffer pair, a third buffer pair, and a fourth buffer pair that are located in a third buffer row 160. For example, as additional levels reach a certain degree of granularity, the distance between buffer rows 160 may be small enough such that buffer pairs are not needed at each buffer row 160.

In some implementations, a set of clock distribution components 110 may be implemented throughout an integrated circuit. In this case, for each clock distribution component 110, a distance between a root buffer pair 130 and a leaf buffer pair 130 that shares a buffer column 150 with the root buffer pair 130 may be the equal. A leaf buffer pair 130 may be a buffer pair 130 that does not have any child buffer pairs 130 associated with the same clock distribution component 110 (e.g., the bottom of clock distribution component 110).

In some implementations, a signal may propagate through clock distribution component 110. For example, a signal may propagate through a root buffer pair 130 to the remaining buffer pairs 130, and the signal may exit clock distribution component 110 via leaf buffer pairs 130. Additionally, a signal may travel through multiple sides of a buffer pair triad 120 in an equal time period. As an example, assume that a signal travels from a first buffer pair 130 in a buffer pair triad 120 to a second buffer pair 130 in the buffer pair triad 120, and from the first buffer pair 130 to a third buffer pair 130. In this case, the time for the signal to travel to the second buffer pair 130 and to the third buffer pair 130 may be equal.

The number and arrangement of buffer pair triads 120 shown in FIG. 1 are provided as an example. In practice, there may be additional buffer pair triads 120/levels, fewer buffer pair triads 120/levels, different buffer pair triads 120/levels, or different arranged buffer pair triads 120/levels than those shown in FIG. 1. Furthermore, two or more buffer pair triads/levels may be implemented as a single buffer pair triad/level, or a single buffer pair triad/level may be implemented as multiple, different buffer pair triads/levels.

Figure 2:
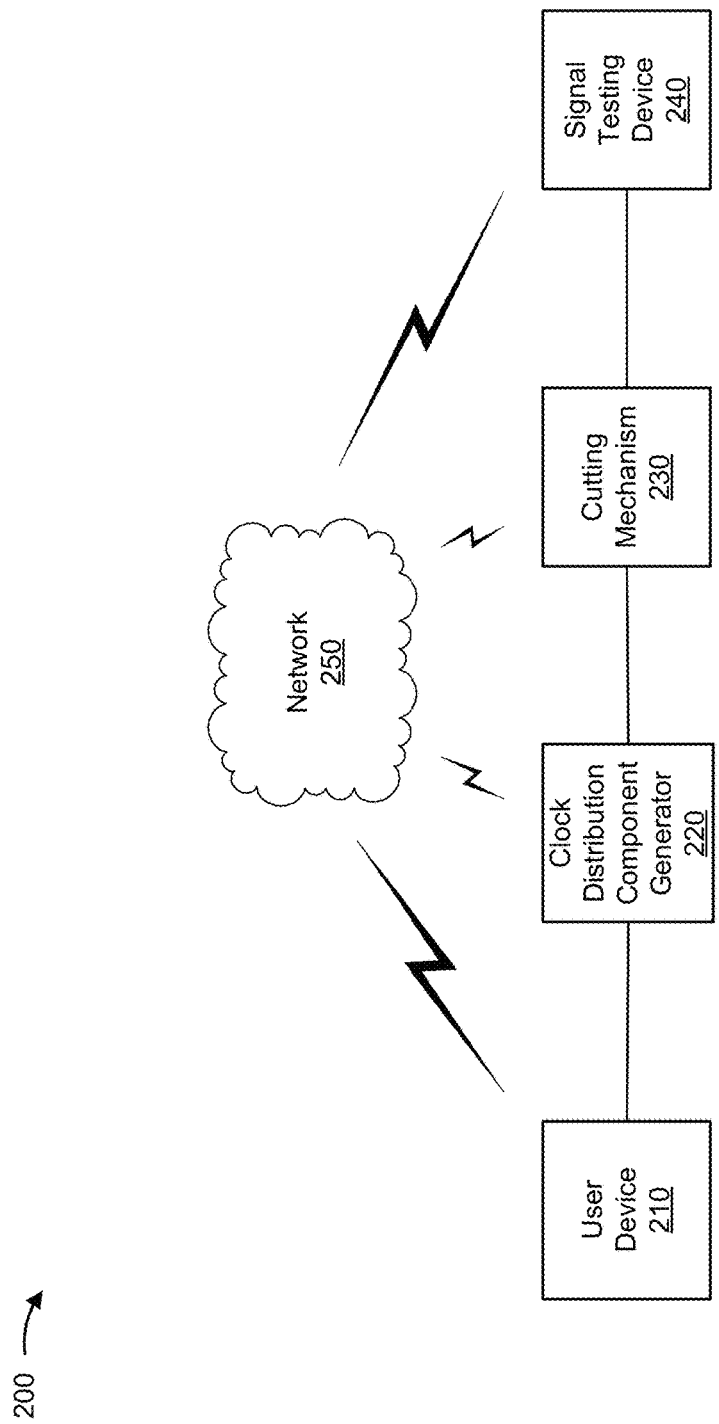
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a user device 210, a clock distribution component generator 220, a cutting mechanism 230, a signal testing device 240, and/or a network 250. Devices of environment 200 may interconnect via wired connections, wireless connections, or a combination of wired and wireless connections.

User device 210 includes one or more devices capable of receiving, storing, processing, testing, and/or providing information associated with clock distribution components. For example, user device 210 may include a server device, a desktop computer, a laptop computer, a tablet computer, or a similar type of device. In some implementations, user device 210 may receive, from another device, information associated with a schematic of an integrated circuit. In some implementations, user device 210 may generate a template for a clock distribution component, and may provide the template to clock distribution component generator 220. In some cases, user device 210 may provide the template via a wired connection. In other cases, user device 210 may provide the template using a wireless connection (e.g., via network 250). In some implementations, user device 210 may provide, to cutting mechanism 230, instructions to remove one or more portions of a clock distribution component. In some implementations, user device 210 may perform one or more actions associated with signal testing device 240.

Clock distribution component generator 220 includes one or more devices capable of generating clock distribution components. For example, clock distribution component generator 220 may include any device or machine capable of creating arrangements of wires and/or buffers (e.g., buffer pairs). In some implementations, clock distribution component generator 220 may use a template to create clock distribution components. In some implementations, clock distribution component generator 220 may provide clock distribution components to cutting mechanism 230 (e.g., via a conveyor belt of an assembly line).

Cutting mechanism 230 includes one or more devices capable of cutting clock distribution components. For example, cutting mechanism 230 may include any device or machine capable of cutting a clock distribution component (e.g., a machine capable of using drills, blades, or the like, to perform cuts). In some implementations, cutting mechanism 230 may remove one or more portions of clock distribution components using instructions received from user device 210 or clock distribution component generator 220.

Signal testing device 240 includes one or more devices capable of performing signal tests on clock distribution components. For example, signal testing device 240 may include a server device, a desktop computer, a laptop computer, a tablet computer, or a similar type of device. In some implementations, signal testing device 240 may receive, from user device 210, one or more models for one or more clock distribution components, where the one or more models represent the clock distribution components after cutting mechanism 230 has performed cuts. In this case, signal testing device 240 may use the one or more models to execute a signal testing procedure. In some implementations, signal testing device 240 may receive, from user device 210, information associated with a schematic of an integrated circuit, information indicating the template, and/or information indicating one or more cut points for one or more clock distribution components. In this case, signal testing device 240 may process the information to create one or more models, and may use the one or more models to execute a signal testing procedure.

Network 250 includes one or more wired and/or wireless networks. For example, network 250 may include a cellular network (e.g., a fifth generation (5G) network, a fourth generation (4G) network, such as a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
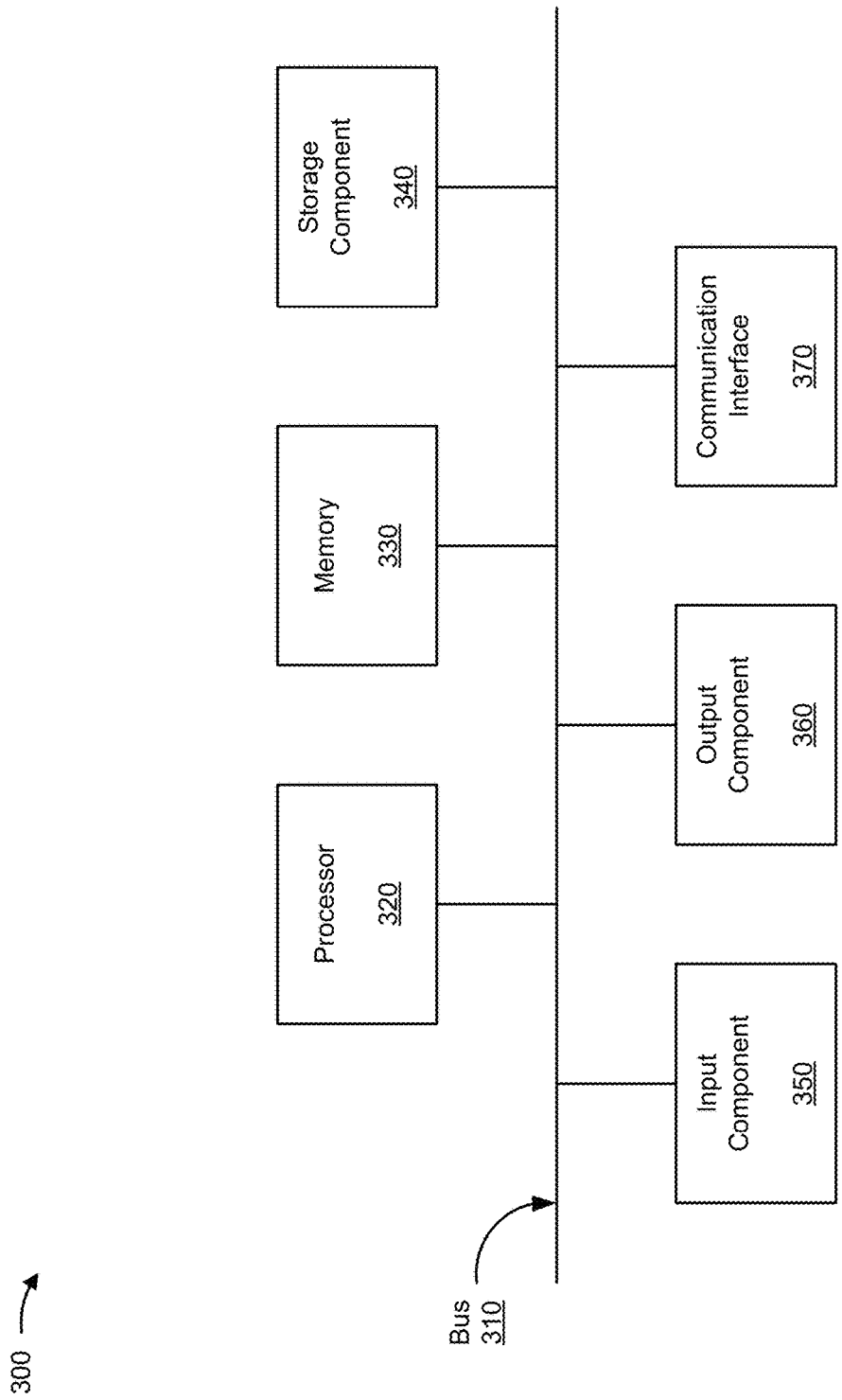
FIG. 3 is a diagram of example components of one or more devices of FIG. 2.

FIG. 3 is a diagram of example components of a device 300. Device 300 may correspond to user device 210, clock distribution component generator 220, cutting mechanism 230, and/or signal testing device 240. In some implementations, user device 210, clock distribution component generator 220, cutting mechanism 230, and/or signal testing device 240 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 includes a component that permits communication among the components of device 300. Processor 320 is implemented in hardware, firmware, or a combination of hardware and software. Processor 320 includes a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 320 includes one or more processors capable of being programmed to perform a function. Memory 330 includes a random access memory (RAM), a read only memory (ROM), and/or another type of dynamic or static storage device (e.g., a flash memory, a magnetic memory, and/or an optical memory) that stores information and/or instructions for use by processor 320.

Storage component 340 stores information and/or software related to the operation and use of device 300. For example, storage component 340 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 350 includes a component that permits device 300 to receive information, such as via user input (e.g., a touch screen display, a keyboard, a keypad, a mouse, a button, a switch, and/or a microphone). Additionally, or alternatively, input component 350 may include a sensor for sensing information (e.g., a global positioning system (GPS) component, an accelerometer, a gyroscope, and/or an actuator). Output component 360 includes a component that provides output information from device 300 (e.g., a display, a speaker, and/or one or more light-emitting diodes (LEDs)).

Communication interface 370 includes a transceiver-like component (e.g., a transceiver and/or a separate receiver and transmitter) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a non-transitory computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
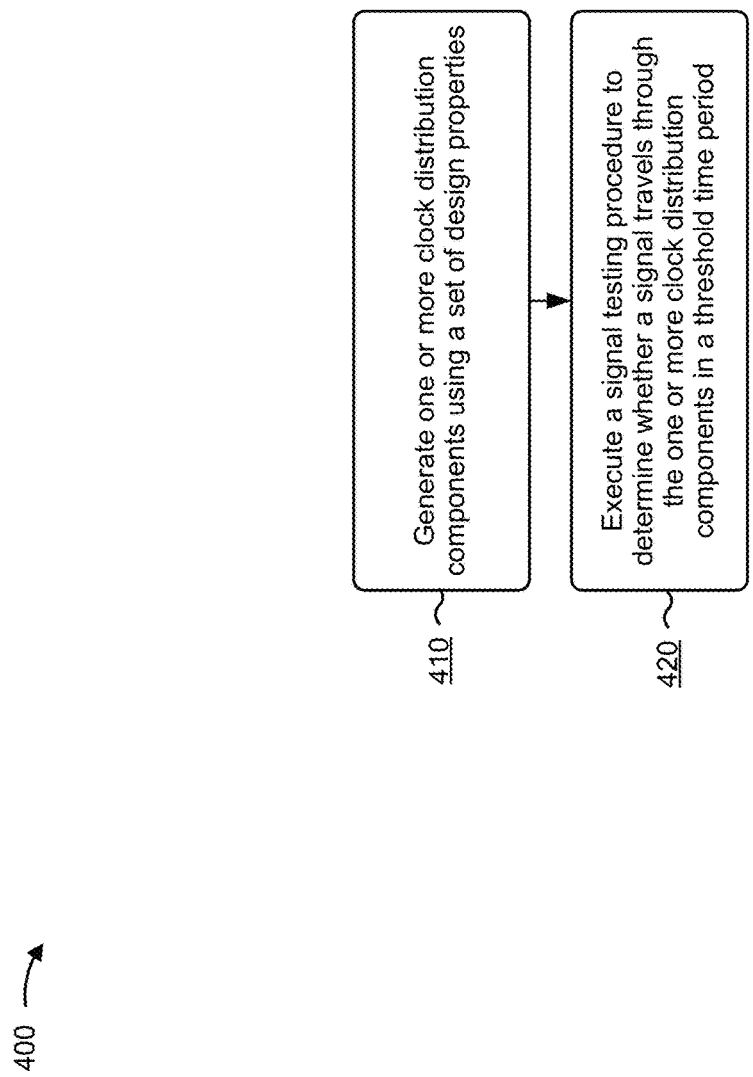
FIG. 4 is a flow chart of an example process for creating, modifying, and/or testing clock distribution components.

FIG. 4 is a flow chart of an example process 400 for creating, modifying, and/or testing clock distribution components. In some implementations, one or more process blocks of FIG. 4 may be performed by user device 210. In some implementations, one or more process blocks of FIG. 4 may be performed by another device or a group of devices separate from or including user device 210, such as clock distribution component generator 220, cutting mechanism 230, signal testing device 240, and/or the like.

As further shown in FIG. 4, process 400 may include generating one or more clock distribution components using a set of design properties (block 410). For example, user device 210 may use a set of design properties to generate a template that may be used to create one or more clock distribution components for an integrated circuit. Alternatively, user device 210 may use a set of design properties to generate one or more clock distribution components directly. A clock distribution component may be a topology of buffer pairs and wires, and may be designed as a medium for a clock signal.

In some implementations, prior to generating a template for a clock distribution component, a user may access user device 210 to input a set of design properties. In some implementations, user device 210 may receive, from another device (e.g., a device accessible by an engineer), information associated with a schematic of an integrated circuit. In this case, user device 210 may analyze (e.g., parse) through the information indicating the set of design properties and/or the information associated with the schematic of the integrated circuit to identify the information to be used for generating the template.

In some implementations, user device 210 may generate a template for a clock distribution component using a set of design properties. The template may include information identifying a physical shape of a clock distribution component, where the set of design properties define the physical shape. In some implementations, the set of design properties may include immutable design properties, such as a design property indicating that the template is to include a set of electrically connected buffer pair triads arranged in a set of levels (e.g., where the buffer pair triads are the same size), a design property indicating that the buffer pair triads are to collectively take the shape of a triangle (e.g., an equilateral triangle), a design property indicating that buffer pairs are to be directionally aligned (e.g., such that buffer pairs that share a buffer column are associated with alternating buffer rows), a design property indicating that one or more levels of the template may be bisected to include additional buffer pairs, a design property indicating to use the same template for each clock distribution component (e.g., to allow each clock distribution component to have a matching height), and/or the like.

Additionally, the set of design properties may include mutable design properties that may vary based on information included in a schematic of an integrated circuit. For example, a team of design engineers may create a schematic of an integrated circuit (e.g., using computer-aided design (CAD)), and the schematic may include one or more clock distribution component placeholders, where dimensions of the clock distribution component placeholders identify locations within the integrated circuit to place one or more clock distribution components. In some cases, each clock distribution component placeholder may include dimensions identifying a length, a width, and/or a height. Additionally, the dimensions of the clock distribution component placeholders may be used to determine dimensions to use for the template of the clock distribution component.

In some implementations, a template for a clock delay component may be used to create additional buffer pairs inside an area defined by an initial buffer pair triad. In this case, the distance between buffer pairs may be defined by a distance formula. For example, a template for a clock distribution component may be created to form a geometric triangle that is defined by levels, where subsequent levels include an increasing number of buffer pair triads, and where buffer pairs are separated by a distance that is defined by the distance formula. In some cases, the above implementation may be used to create a clock delay component directly (e.g., without a need for a template).

As an example, the distance formula may state that the distance between buffer pairs for a particular level in clock distribution component 110 is defined as a first distance divided by two to the power of N. In this example, the first distance may be a distance between two buffer pairs of an initial buffer pair triad that share a buffer row (e.g., shown in FIG. 1 as the distance between point C and point D), and the value of N may vary depending on a particular level of clock distribution component 110.

Additionally, the distance formula may be used to determine a distance between buffer pairs for one or more levels of clock delay component 110. For example, for the first and second levels of clock distribution component 110, buffer pairs may be separated by a distance shown in FIG. 1 as the distance between point C and point D (e.g., where N is equal to zero). As another example, for the third level of clock distribution component 110, buffer pairs may be separated by a distance shown in FIG. 1 as the distance between point D and point E (e.g., where N is equal to the value one). As another example, for the fourth level of clock distribution component 110, buffer pairs may be separated by a distance shown in FIG. 1 as the distance between point F and point G (e.g., where N is equal to the value two). As another example, for the fifth level of clock distribution component 110, buffer pairs may be separated by a distance shown in FIG. 1 as the distance between point H and point I (e.g., where N is equal to the value four).

In some implementations, the set of design properties may include a design property indicating to use a largest dimension associated with a clock distribution component placeholder of a schematic as a length for two of the sides of the template. For example, the user device may execute an application to analyze dimensions of the clock distribution component placeholders to identify a largest dimension, and may use the largest dimension as a length for two of the sides of the template (e.g., as shown in FIG. 1A). In this case, because a design property may indicate a fixed size for buffer pair triads, the length may dictate a number of levels of buffer pair triads needed for the template.

In some implementations, the set of design properties may include a design property indicating to use the largest dimension associated with the clock distribution component placeholders to determine a number of levels of buffer pair triads to use for the template. For example, assume that a design property of the template indicates that buffer pair triads are to collectively take the shape of a triangle (e.g., an equilateral triangle). Further assume that the user device identifies a largest dimension to use as a length for two of the sides of the template. In this case, user device 210 may create levels of buffer pair triads to form a triangle with two sides equal to a length associated with the largest dimension.

In some implementations, user device 2310 may provide the template to a first device to cause the first device to create one or more clock distribution components. For example, user device 210 may provide the template to clock distribution component generator 220, which may cause clock distribution component generator 220 (e.g., a single device, a group of devices working together) to create one or more clock distribution components that share the set of design properties associated with the template. In this case, because each of the one or more clock distribution components is created using the largest dimension identified in the schematic, one or more of the one or more clock distribution components may need to be cut to satisfy the dimensions indicated by the schematic.

In some implementations, user device 210 may provide the template to clock distribution component generator 220. For example, clock distribution component generator 220 may be configured to automatically create clock distribution components, and user device 210 may provide the clock distribution component template (or dimensions associated with the template) to the clock distribution component generator. In this case, clock distribution component generator 220 may use the template to create the one or more clock distribution components.

In this way, user device 210 is able to provide clock distribution component generator 220 with a template that may be used to create one or more clock distribution components.

In some implementations, user device 210 may cause a second device to remove one or more portions of the one or more clock distribution components. For example, clock distribution component generator 220 may provide the one or more clock distribution components to cutting mechanism 230, and user device 210 may provide, to cutting mechanism 230, instructions to remove one or more portions of the one or more clock distribution components. In this case, the instructions may cause cutting mechanism 230 may remove one or more portions of the one or more clock distribution components.

In some implementations, cutting mechanism 230 may use the instructions to remove one or more portions of a clock distribution component. For example, the instructions may identify cut points that are associated with the end points of the one or more clock distribution component placeholders, which may cause cutting mechanism 230 to cut one or more clock distribution components at the identified cut points. In this case, the cut may remove wiring, buffer pairs, or the like, and may provide the clock distribution component with a dimension (e.g., a width) that matches the dimension indicated by the clock distribution component placeholder.

By cutting clock distribution components at cut points associated with end points of the clock distribution component placeholders, the clock distribution components may be placed onto the integrated circuit at the locations identified by the clock distribution component placeholders.

In some implementations, user device 210 may use a set of design properties to generate the one or more clock distribution components directly. For example, user device 210 may receive, from another device (e.g., a device accessible by an engineer), information associated with a schematic of an integrated circuit. In this case, user device 210 may analyze (e.g., parse) through the information indicating the set of design properties and/or the information associated with the schematic of the integrated circuit to identify the information to be used for generating the one or more clock distribution components. In this way, user device 210 may generate clock distribution components directly, rather than generating a template and cutting clock distribution components based on a dimension of the template.

As further shown in FIG. 4, process 400 may include executing a signal testing procedure to determine whether a signal travels through the one or more clock distribution components in a threshold time period (block 420). For example, user device 210 (or signal testing device 240) may execute a signal testing procedure using a simulation program with integrated circuit emphasis (SPICE), a static timing analysis (STA) model, or the like.

In some implementations, user device 210 may execute a signal testing procedure on each clock distribution component of the one or more clock distribution components. For example, user device 210 may send a clock signal (or execute a test that simulates a clock signal) through each of the clock distribution components. In this case, the test may, for each clock distribution component, output a time stamp indicating a total time a clock signal spent traveling through a clock distribution component.

In some implementations, the signal testing procedure may output time stamps that satisfy a threshold time period. For example, user device 210 may send a first clock signal through a first clock distribution component and may send a second clock signal through a second clock distribution component. In this case, a time stamp associated with the first clock signal and a time stamp associated with the second clock signal may satisfy a threshold time period (e.g., the time stamps may match, or may be within a threshold range of each other).

In this way, user device 210 (or signal testing device 240) determines whether clock signals traveling through the one or more clock distribution components are able to travel through the one or more clock distribution components in a threshold time period.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

By using a set of design properties to generate clock distribution components, clock signals may be synchronized to one or more signal end points in an integrated circuit, thereby significantly decreasing a manufacturing process time relative to manually creating and modifying clock distribution components (e.g., a clock distribution providing signal synchronization may be generated in several hours instead of five to six months). Additionally, by using a uniform template or by creating the clock distribution components directly, manufacturing variances may be minimized or eliminated (e.g., relative to creating clock distribution components with different sized heights).

Furthermore, using a template for creating clock distribution components may apply to integrated circuits of different sizes by altering the dimensions of the template while maintaining the set of design properties, thereby allowing the template to be re-used for any number of different integrated circuit designs (e.g., different on-chip variations). Additionally, by efficiently distributing clock signals throughout an integrated circuit with low skew, the clock distribution utilizes less power (e.g. less short circuit current from buffers shorted together to increase tolerance to PVT variation) than a clock distribution without the clock distribution components described herein, thereby conserving power and improving performance of the integrated circuit.

FIGS. 5A-5D are diagrams of an overview of an example implementation 500 described herein. FIGS. 5A-5D show a process for creating and testing a set of clock distribution components in a global clock distribution that uses a gridded methodology. However, other implementations may involve creating and testing clock distribution components in a global clock distribution that uses a different methodology (e.g., an H-tree methodology, a spine methodology, etc.). Additionally, or alternatively, other implementations may involve creating and testing clock distribution components in a local clock distribution within a design block.

Figure 5A:
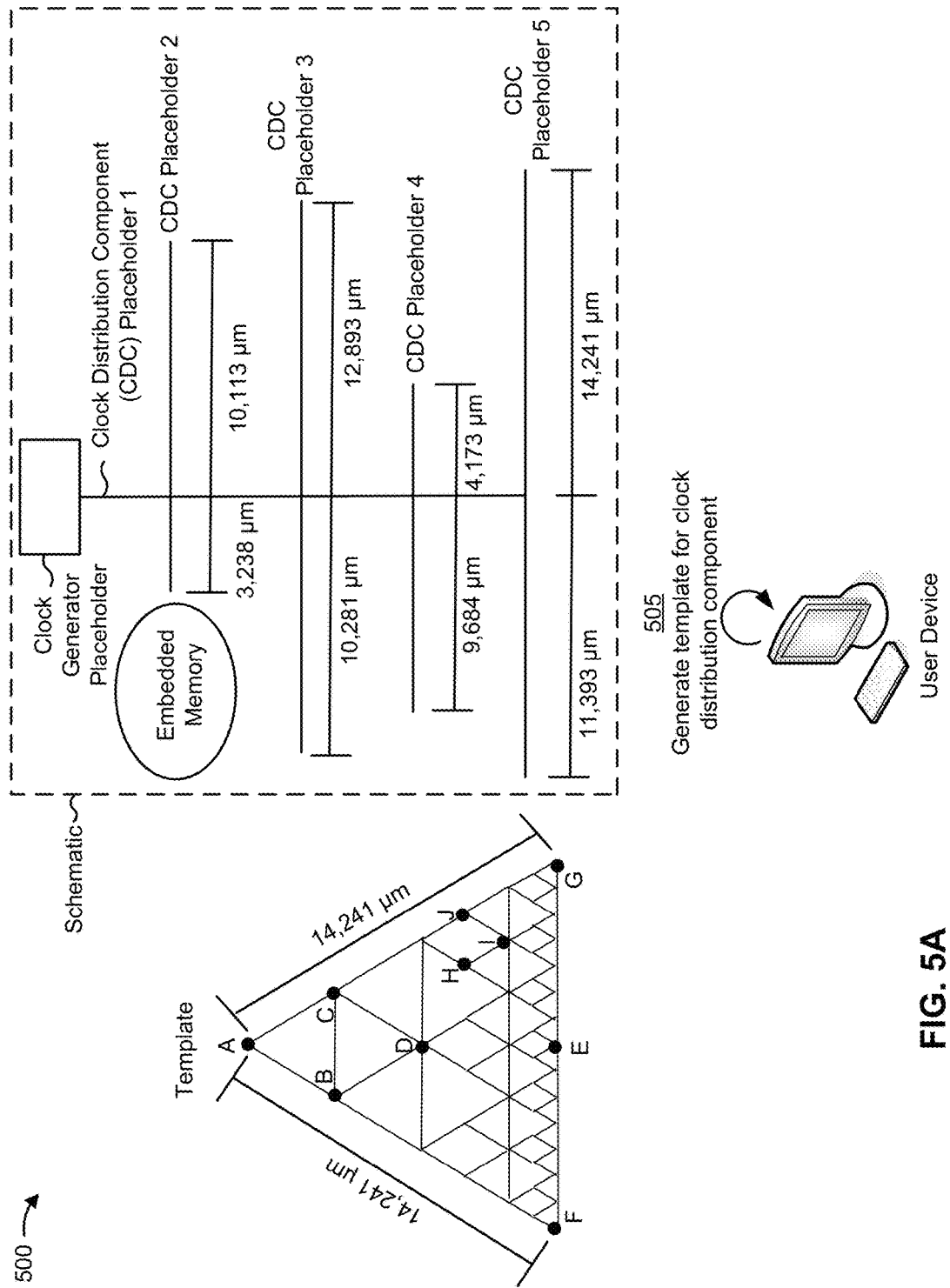
FIGS. 5A-5D are a diagram of an overview of an example implementation described herein.

As shown in FIG. 5A, and by reference number 505, a user device may generate a template for a clock distribution component. For example, the user device may use a set of design properties to generate a re-usable template for a clock distribution component that may be used to create a set of clock distribution components for an integrated circuit. A clock distribution component may be a topology of buffer pairs and wires, and may be designed as a medium for a clock signal. The purpose of creating clock distribution components is to synchronize a clock signal from a clock generator to a set of signal end points (e.g., flip-flops).

In this case, the template may include information identifying a physical shape of a clock distribution component, where the set of design properties define the physical shape. The set of design properties may include immutable design properties, such as a design property indicating that the template is to include a set of electrically connected buffer pair triads arranged in a set of levels (e.g., as shown, point A, point B, and point C connect to form a buffer pair triad, where each point is a buffer pair), a design property indicating that the buffer pair triads are to collectively take the shape of a triangle (e.g., as shown by the triangle with vertices indicated as point A, point F, and point G), a design property indicating that buffer pairs are to be directionally aligned (e.g., as shown by point A, point D, and point E being aligned as part of the same buffer column), a design property indicating that one or more levels of the template may be bisected to include additional buffer pairs (e.g., as shown by point H, point I, and point J), and/or the like.

Additionally, the set of design properties may include mutable design properties that may be based on information included in a schematic of an integrated circuit. For example, a schematic may include a set of clock distribution component placeholders, and the set of clock distribution component placeholders may include dimensions that may be used to determine dimensions of the template. In this case, a design property may indicate to use a largest dimension associated with a clock distribution component placeholder of a schematic as a length for two of the sides of the template. Additionally, a design property may indicate to use the largest dimension to determine a number of levels of buffer pair triads to use for the template.

Shown as an example, assume a team of design engineers create a schematic of an integrated circuit, and the schematic includes a set of clock distribution component placeholders (shown as clock distribution component (CDC) placeholders 1 through 5), where dimensions of the clock distribution component placeholders identify locations within the integrated circuit to place the set of clock distribution components. In this example, further assume that the CDC placeholders have different widths due to blockages (e.g., due to placement of embedded memory on the chip). As an example, the empty area circled to the left of CDC placeholder 2 may be reserved for embedded memory (which is why the left hand side of CDC placeholder 2 cannot extend as far to the left as CDC placeholder 3).

Additionally, the user device may analyze the schematic to identify a largest dimension associated with the clock distribution component placeholders. For example, the application may analyze dimensions associated with clock distribution component placeholder 2 (e.g., 3, 238 microns (µm) and 10,113 µm), dimensions associated with clock distribution component placeholder 3 (10,281 µm and 12,893 µm), dimensions associated with clock distribution component placeholder 4 (9,684 µm and 4,173 µm), dimensions associated with clock distribution component placeholder 5 (11,393 µm and 14,241 µm), and may identify 14,241 µm as the largest dimension associated with the clock distribution component placeholders. In this case, the user device may use the largest dimension as the length for two of the sides of the template (e.g., as shown by the template having two sides of length 14,241 µm).

Additionally, the user device may use the largest dimension associated with the set of clock distribution component placeholders to determine a common number of levels of buffer pair triads to use for the template. For example, assume that a design property of the template indicates that buffer pair triads are to collectively take the shape of a triangle (e.g., an isosceles triangle). Further assume that the user device identifies a largest dimension to use as a length for two of the sides of the template. In this case, the user device may create levels of buffer pair triads to form a triangle with two sides equal to a length associated with the largest dimension (e.g., as shown, a buffer pair triad using point A, point B, and point C may be part of a first level, a buffer pair triad using point B, point C, and point D may be part of a second level, etc.).

In some implementations, the user device may provide the template to a clock distribution component generator (e.g., a device capable of creating clock distribution components) to allow the clock distribution component generator to create the set of clock distribution components.

In this way, the user device may generate a template that may be used to create a set of clock distribution components.

Figure 5B:
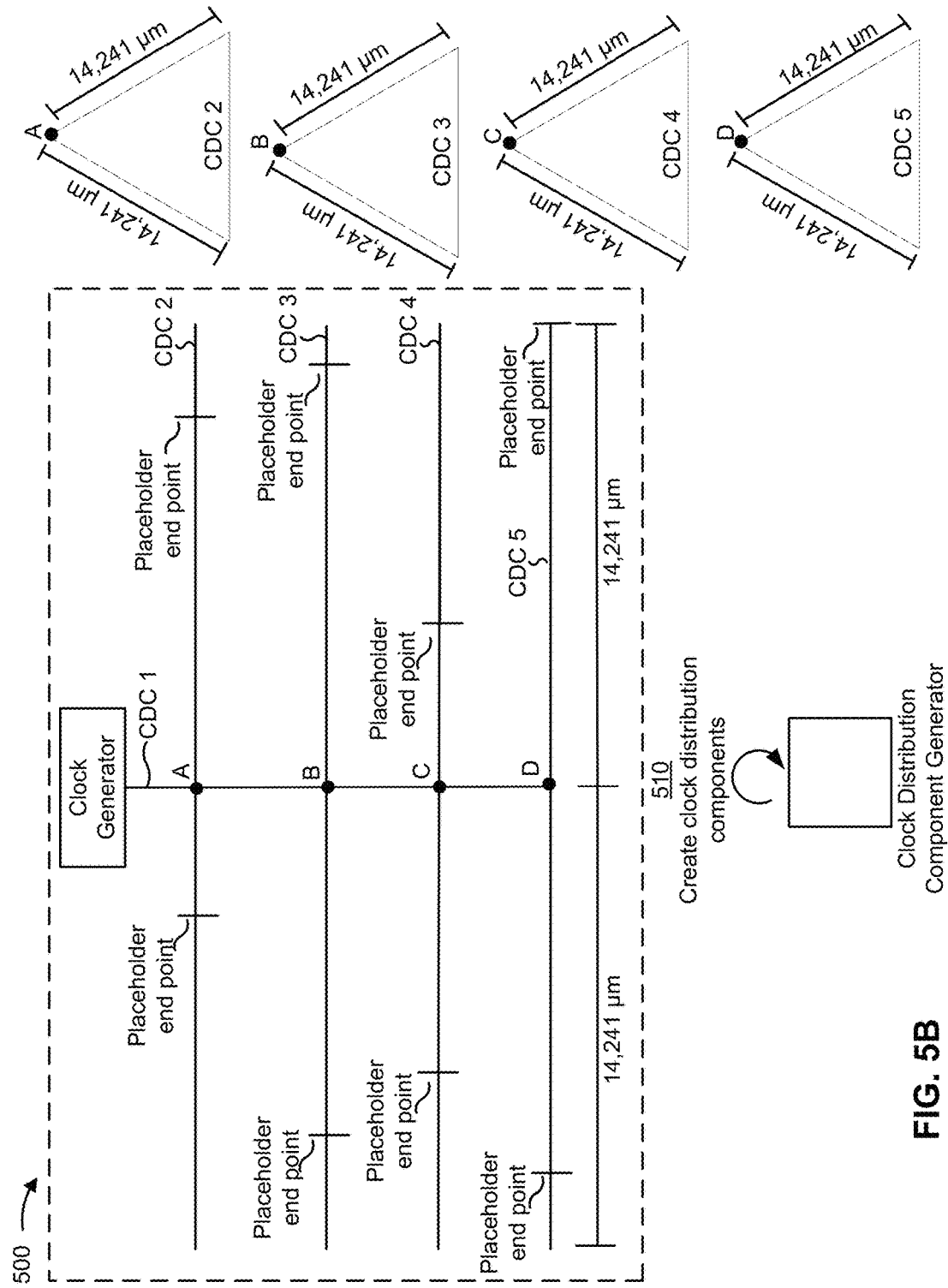

As shown in FIG. 5B, and by reference number 510, the clock distribution component generator may create the set of clock distribution components. For example, the clock distribution component generator may create the set of clock distribution components using the template. In this case, the clock distribution component generator may use the template to create the set of clock distribution components (e.g., shown as the triangles CDC 2, CDC 3, CDC 4, and CDC 5).

For purposes of illustration, the set of clock distribution components are shown on the schematic in relation to the clock distribution component placeholders. As shown, because the largest dimension is used to create the set of clock distribution components, many of the dimensions of the set of clock distribution components extend beyond the area requested by the schematic placeholders (e.g., as shown by the lines that represent clock distribution components extending beyond the end points of the clock distribution component placeholders). As described below, a cutting mechanism may remove one or more portions of clock distribution components to allow each clock distribution component to fit into the integrated circuit in a manner that is compliant with the dimensions requested in the schematic.

In this way, the clock distribution component generator is able to use the template to create the set of clock distribution components.

Figure 5C:
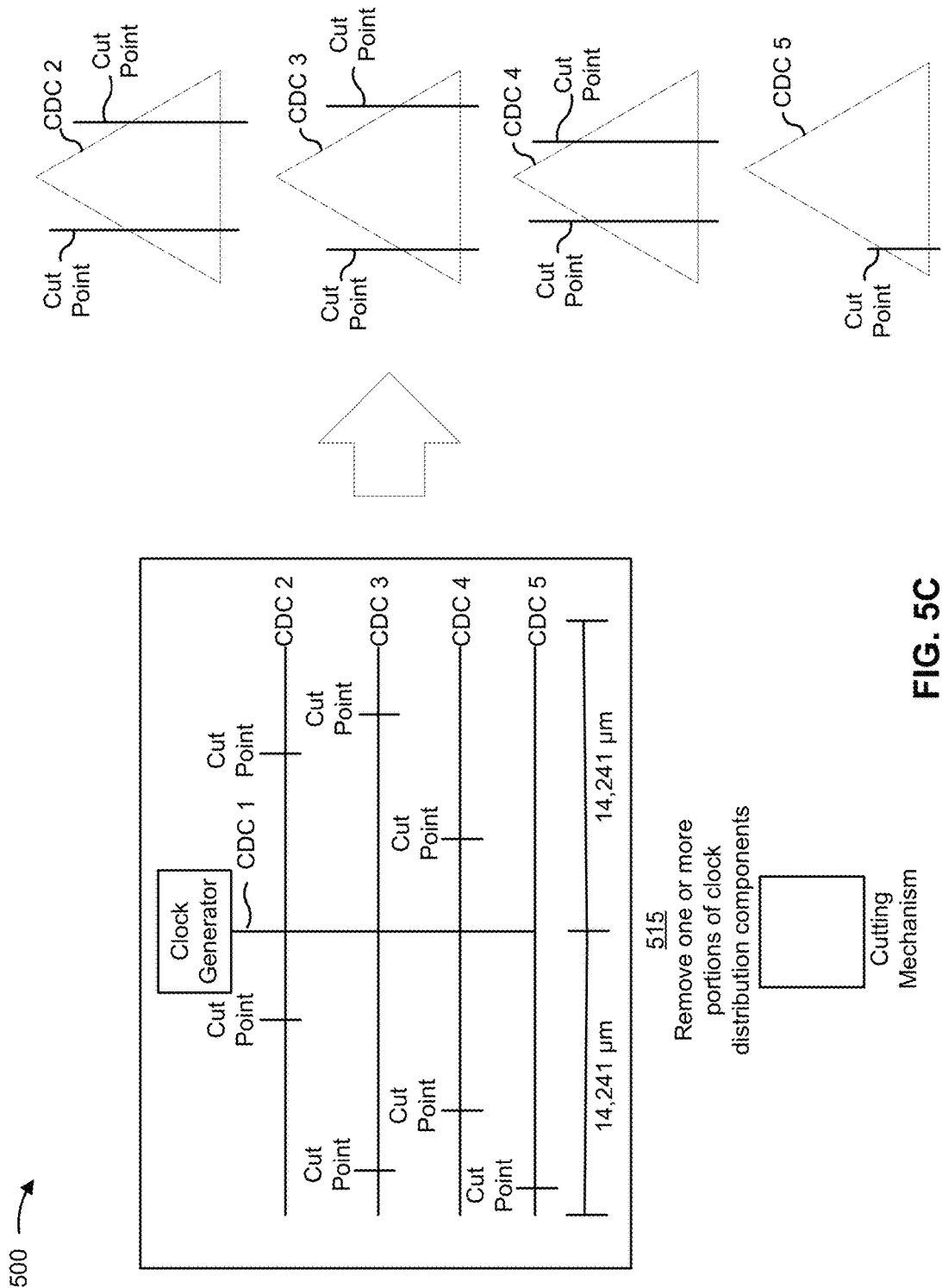

As shown in FIG. 5C, and by reference number 515, a cutting mechanism may remove one or more portions of one or more clock distribution components. For example, the cutting mechanism may receive instructions (e.g., from the user device, from the clock distribution component generator, etc.) to remove one or more portions of one or more clock distribution components. In this case, the instructions may identify cut points that are associated with the end points of the clock distribution component placeholders. In this case, the instructions may cause the cutting mechanism to cut the clock distribution components at the identified cut points. As shown, the set of clock distribution components (e.g., CDC 2, CDC 3, CDC 4, and CDC 5) may be cut at the cut points to remove any wiring, buffer pairs, or the like.

By cutting clock distribution components at cut points associated with end points of the clock distribution component placeholders, the clock distribution components may be placed onto the integrated circuit at the locations identified by the clock distribution component placeholders. Furthermore, because the clock distribution components have a matching height (e.g., a fixed height), and because the buffer pair triads preserve the electrical integrity of the clock distribution component (regardless of the cut location), the set of clock distribution components may be cut in a manner that is compliant with the dimensions requested in the schematic, while still allowing a clock signal to travel through each of the clock distribution components in a threshold time period, as described below.

Figure 5D:
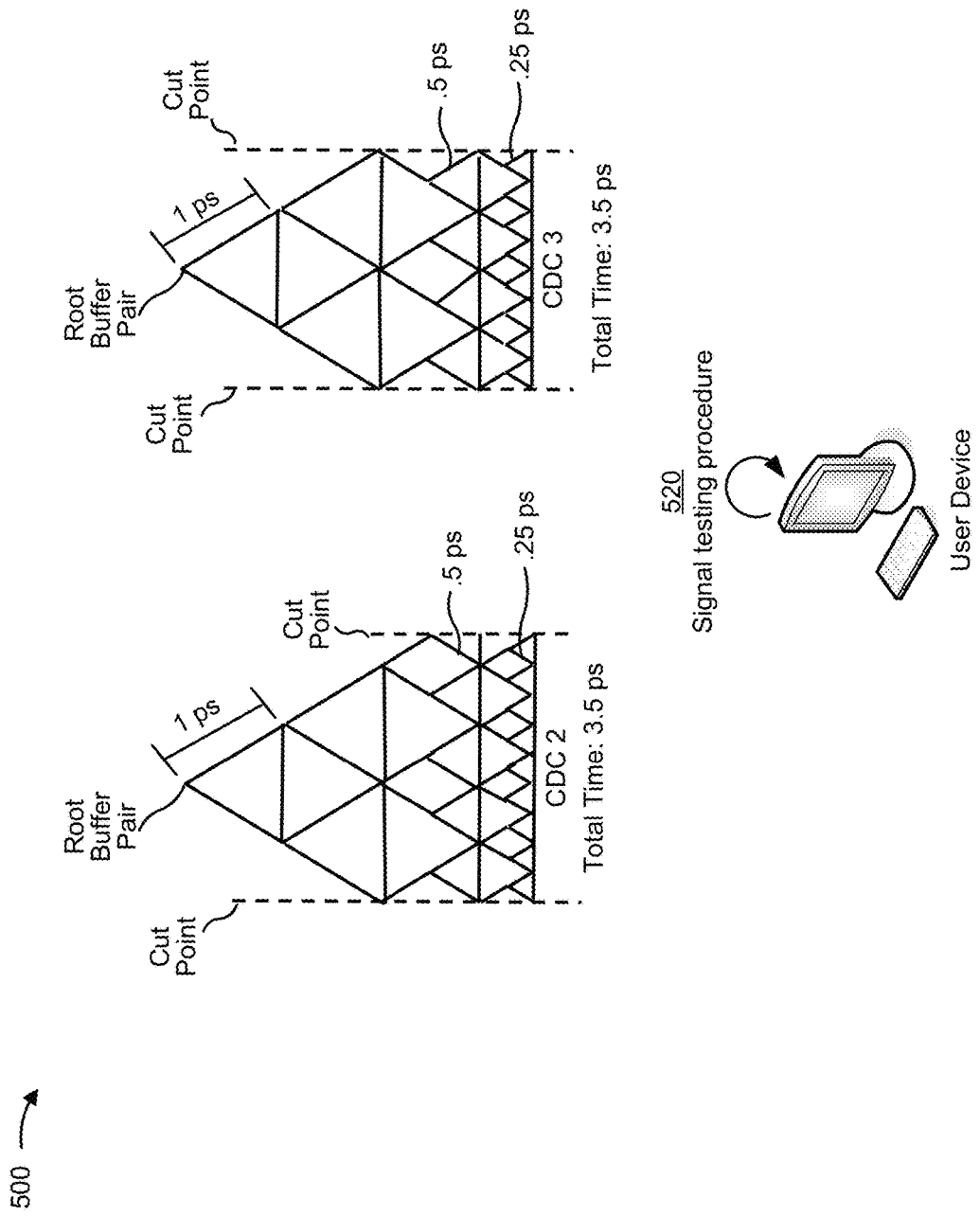

As shown in FIG. 5D, and by reference number 520, the user device may execute a signal testing procedure to determine a time for a clock signal to travel through each clock distribution component of the set of clock distribution components. For example, the user device may execute a signal testing procedure using a simulation program with integrated circuit emphasis (SPICE), a static timing analysis (STA) model, or the like. In this case, the user device may send a clock signal (or execute a test that simulates a clock signal) through each of the clock distribution components. The test may cause a clock signal to travel through each of the set of clock distribution components, and may output a time stamp indicating a total time the clock signal spent traveling through a particular clock distribution component. In some cases, a device other than the user device may execute the signal testing procedures in the manner described above.

As shown, a first clock signal may travel through CDC 2 in a total time of 3.5 picoseconds (ps), and a second clock signal may travel through CDC 3 in a total time of 3.5 ps, despite CDC 2 and CDC 3 having different dimensions due to having different cut points. In this case, the design properties allow clock signals to travel through the clock distribution components in the same time period, even if the clock distribution components have different lengths and/or widths (e.g., due to having buffer pair triads of the same size, due to each clock distribution component having the same height, due to having directionally aligned buffer pairs to maintain the electrical integrity of the clock distribution components, etc.).

In this way, clock signals may travel through each of the clock distribution components in the same (or nearly the same) time period, regardless of cuts that have been made to one or more of the clock distribution components. By synchronizing an amount of time for a clock signal to travel through each of the clock distribution components, the clock distribution components may be used to distribute clock signals from the clock generator to the set of clock sinks (e.g., using the clock distribution components as a medium).

As indicated above, FIGS. 5A-5D are provided merely as an example. Other examples are possible and may differ from what was described with regard to FIGS. 5A-5D. For example, in a different implementation, a set of clock distribution components may be created directly using the desired size (e.g., without first creating a template and trimming to the desired widths).

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A clock distribution component, comprising:
a plurality of electrically connected buffer pair triads arranged in a plurality of levels,
where a buffer pair triad, of the plurality of buffer pair triads, includes three buffer pairs,
where buffer pairs in the buffer pair triad are connected via wire,
where each buffer pair triad, of the plurality of buffer pair triads, shares at least one buffer pair with one or more buffer pair triads of the plurality of buffer pair triads,
where buffer pairs, of the plurality of buffer pair triads, are arranged in buffer rows and buffer columns;
the plurality of levels including:
a first level associated with a first buffer pair triad, and
one or more additional levels,
where each additional level, of the one or more additional levels, includes at least three buffer pair triads, and
where an additional level, of the one or more additional levels, includes at least two more buffer pair triads and/or at least two less buffer pair triads than an adjacent level of the one or more additional levels;
where buffer pairs associated with the one or more additional levels are aligned in buffer columns, and the buffer pairs are a distance apart that is defined by a distance formula,
where the first buffer pair triad includes a root buffer pair associated with a first buffer column of the buffer columns,
where the first buffer pair triad includes two child buffer pairs, a first child buffer pair, of the two child buffer pairs, being associated with a second buffer column of the buffer columns, and a second child buffer pair, of the two child buffer pairs, being associated with a third buffer column of the buffer columns, and
where an additional level, of the one or more additional levels and adjacent to the first level, includes a second buffer pair triad of the plurality of buffer pair triads, a third buffer pair triad of the plurality of buffer pair triads, and a fourth buffer pair triad of the plurality of buffer pair triads.

2. The clock distribution component of claim 1,
where the clock distribution component is a first clock distribution component included in an integrated circuit with a set of clock distribution components, and
where the first clock distribution component and the set of clock distribution components have a matching height and a matching plurality of levels,
where a height is associated with a distance between a root buffer pair and a leaf buffer pair that shares a buffer column with the root buffer pair.

3. The clock distribution component of claim 1, where
the second buffer pair triad and the third buffer pair triad share the first child buffer pair with the first buffer pair triad,
the third buffer pair triad and the fourth buffer pair triad share the second child buffer pair with the first buffer pair triad, and
the second buffer pair triad, the third buffer pair triad, and the fourth buffer pair triad share a buffer pair associated with the first buffer column.

4. The clock distribution component of claim 1,
where buffer pair triads associated with at least one of the additional levels include three additional buffer pairs,
the three additional buffer pairs being located at bisections of wires connecting the buffer pairs of the buffer pair triads associated with the at least one of the additional levels,
where two of the three additional buffer pairs are connected via wire, and
where the buffer pair triads are included in the plurality of buffer pair triads.

5. The clock distribution component of claim 1, where a portion of one or more buffer pair triads are removed to allow the clock distribution component to satisfy a size requirement included in a schematic for an integrated circuit.

6. The clock distribution component of claim 5,
where the clock distribution component is a first clock distribution component of a set of clock distribution components associated with the integrated circuit, and
where the set of clock distribution components are designed to allow signals to travel through each clock distribution component of the set of clock distribution components in a threshold time period.

7. A method, comprising:
generating, by a device, one or more clock distribution components using a set of design properties,
the set of design properties including at least one of:
a design property indicating that a clock distribution component is to include a plurality of electrically connected buffer pair triads arranged in a plurality of levels,
a design property indicating to use one or more dimensions associated with a schematic of an integrated circuit as dimensions for the one or more clock distribution components, or
a design property indicating that the one or more clock distribution components are to include a fixed height;
generating, by the device, a template for the one or more clock distribution components;
providing, by the device and to another device, an instruction to create the one or more clock distribution components,
the instruction causing the other device to use the template to create the one or more clock distribution components, and
the instruction causing a width of a clock distribution component, of the one or more clock distribution components, to be different than a width of another clock distribution component, of the one or more clock distribution components; and
executing, by the device and after generating the one or more clock distribution components, a signal testing procedure to determine whether a clock signal travels through each of the one or more clock distribution components in a threshold time period.

8. The method of claim 7, where the set of design properties further include at least one of:
a design property indicating that buffer pair triads include three buffer pairs that are connected via wire,
a design property indicating that buffer pairs are to be arranged in buffer rows and buffer columns,
where buffer pairs that share a buffer column are associated with alternating buffer rows, or
a design property indicating that one or more buffer pair triads are to include three additional buffer pairs,
the three additional buffer pairs being located at bisections of wires connecting the three buffer pairs of the buffer pair triads.

9. The method of claim 7, further comprising:
receiving, prior to generating the one or more clock distribution components, information associated with the schematic of the integrated circuit,
the information including one or more dimensions identifying one or more clock distribution component placeholders that identify locations within the integrated circuit to place one or more clock distribution components; and
analyzing the information associated with the schematic of the integrated circuit to identify a largest dimension of the one or more dimensions to use for generating the one or more clock distribution components,
the largest dimension being associated with the design property indicating to use the dimension associated with the schematic of the integrated circuit.

10. The method of claim 7, further comprising:
providing, to another device and after generating the template, an instruction to remove one or more portions of one or more clock distribution components of the one or more clock distribution components.

11. The method of claim 7, where executing the signal testing procedure comprises:
executing the signal testing procedure on a first clock distribution component and a second clock distribution component of the one or more clock distribution components,
the signal testing procedure to send a first clock signal through the first clock distribution component in a first time period, and
the signal testing procedure to send a second clock signal through the second clock distribution component in a second time period,
where the first time period and the second time period satisfy the threshold time period.

12. The method of claim 7, where the one or more clock distribution components have a matching height,
where a height is associated with a distance between a root buffer pair and a leaf buffer pair that shares a buffer column with the root buffer pair.

13. The method of claim 7, where, for at least one clock distribution component of the one or more clock distribution components, a portion of one or more buffer pair triads are removed to allow the at least one clock distribution component to satisfy a size requirement included in a schematic for an integrated circuit.

14. An integrated circuit, comprising:
one or more clock distribution components,
the one or more clock distribution components including a plurality of electrically connected buffer pair triads arranged in a plurality of levels,
where a buffer pair triad, of the plurality of buffer pair triads, includes three buffer pairs,
where buffer pairs in the buffer pair triad are connected via wire,
where each buffer pair triad, of the plurality of buffer pair triads, shares at least one buffer pair with one or more buffer pair triads of the plurality of buffer pair triads,
the plurality of levels including a first level associated with a first buffer pair triad, and one or more additional levels, where each additional level, of the one or more additional levels, includes at least three buffer pair triads, where an additional level, of the one or more additional levels, includes at least two more buffer pair triads and/or at least two less buffer pair triads than an adjacent level of the one or more additional levels, and where buffer pair triads associated with at least one of the additional levels include three additional buffer pairs, the three additional buffer pairs being located at bisections of wires connecting the buffer pairs of the buffer pair triads associated with the at least one of the additional levels.

15. The integrated circuit of claim 14, where buffer pairs are arranged in buffer rows and buffer columns, and where the one or more clock distribution components have a matching height, where a height is associated with a distance between a root buffer pair and a leaf buffer pair that shares a buffer column with the root buffer pair.

16. The integrated circuit of claim 14, where buffer pairs are arranged in buffer rows and buffer columns, and where buffer pairs that share a buffer column are associated with alternating buffer rows.

17. The integrated circuit of claim 14, where the one or more clock distribution components are a set of clock distribution components; and where a signal travels through each clock distribution component of the set of clock distribution components in an equal time period.

18. The integrated circuit of claim 14, where the one or more clock distribution components are a set of clock distribution components; and where a portion of one or more buffer pair triads associated with one or more clock distribution components of the set of clock distribution components are removed.

19. The integrated circuit of claim 18, where a signal travels through each clock distribution component of the set of clock distribution components in an equal time period.

20. The integrated circuit of claim 14, where the one or more clock distribution components are a set of clock distribution components; and where a signal travels through each clock distribution component of the set of clock distribution components in a threshold time period.

\* \* \* \* \*